United States Patent
Yamamoto et al.

(10) Patent No.: US 8,609,493 B2
(45) Date of Patent: *Dec. 17, 2013

(54) METHOD OF FABRICATING SEMICONDUCTOR DEVICE

(75) Inventors: Hideo Yamamoto, Kanagawa (JP); Kei Takehara, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/527,179

(22) Filed: Jun. 19, 2012

(65) Prior Publication Data

US 2012/0282745 A1      Nov. 8, 2012

Related U.S. Application Data

(63) Continuation of application No. 12/760,152, filed on Apr. 14, 2010, now Pat. No. 8,222,109.

(30) Foreign Application Priority Data

Apr. 27, 2009 (JP) ................................. 2009-107347

(51) Int. Cl.
    H01L 21/00        (2006.01)
(52) U.S. Cl.
    USPC .................................. 438/270; 257/E21.615
(58) Field of Classification Search
    USPC ................................................. 438/268–272
    See application file for complete search history.

(56) References Cited

U.S. PATENT DOCUMENTS

| 7,488,642 B2 | 2/2009 | Cheng |
| 7,800,187 B2 | 9/2010 | Matsuura |
| 8,222,109 B2 * | 7/2012 | Yamamoto et al. ........... 438/270 |
| 2006/0267085 A1 | 11/2006 | Matsuura |
| 2008/0233758 A1 | 9/2008 | Jung |
| 2010/0176445 A1 | 7/2010 | Hsieh |

FOREIGN PATENT DOCUMENTS

JP      2006-324488 A     11/2006

OTHER PUBLICATIONS

P. Moens et al., Record-low on Resistance for 0.35 μm based integrated XtreMOS™ Transistors, Proceedings of the 19$^{th}$ International Symposium on Power Semiconductor Devices & ICs, May 2007, pp. 57-60.

* cited by examiner

Primary Examiner — Richard Booth
(74) Attorney, Agent, or Firm — Foley & Lardner LLP

(57) ABSTRACT

A method of fabricating a semiconductor device according to the present invention includes forming a first trench and a second trench by etching the first trench further, in an epitaxial layer formed over a substrate, extending a width of the second trench, forming an oxidize film by oxidizing the extended second trench, and filling an electrode material in the first trench and the second trench including the oxidized film formed therein. The method of fabricating a semiconductor device according to the present invention enables to fabricate a semiconductor device that improves the withstand voltage between a drain and a source and reduce the on-resistance.

8 Claims, 10 Drawing Sheets

PRIOR ART

METHOD OF FABRICATING SEMICONDUCTOR DEVICE

CROSS-REFERENCE TO RELATED PATENT APPLICATIONS

Japan Priority Application 2009-107347, filed Apr. 27, 2009 including the specification, drawings, claims and abstract, is incorporated herein by reference in its entirety. This application is a Continuation of U.S. application Ser. No. 12/760,152, filed Apr. 14, 2010, incorporated herein by reference in its entirety.

BACKGROUND OF THE INVENTION

1. Field of the Invention

The present invention relates to a method of fabricating a semiconductor device, and particularly to a method of fabricating a vertical MOSFET including a trench gate.

2. Description of Related Art

In recent years, high integration of a semiconductor device is rapidly proceeding by development of microfabrication technology. Above all, a vertical MOSFET including a gate electrode deposited in a trench is widely known as a semiconductor device that realizes low on-resistance and high withstand voltage. Such vertical MOSFET is formed by forming a trench in an epitaxial layer, and depositing a gate electrode made of polysilicon or the like in the trench.

Then, in the vertical MOSFET, an on-resistance (hereinafter also referred to as Ron) is greatly dependent on the resistance of an epitaxial layer, and the resistance of the epitaxial layer decreases as the dope concentration to the epitaxial layer increases. On the other hand, the withstand voltage between a drain and a source decreases as the dope concentration to the epitaxial layer increases. Therefore, there is a trade-off between the on-resistance and the withstand voltage between a drain and a source of the vertical MOSFET. Accordingly, there is an optimal dope concentration of the epitaxial layer in light of the on-resistance and the withstand voltage between a drain and a source, and the dope concentration cannot be increased more than a certain concentration.

FIG. 6 is a cross-sectional diagram of the vertical MOSFET disclosed in P. Moens "Record-low on-Resistance for 0.35 µm based integrated XtreMOS™ Transistors" Proceedings of the 19th International Symposium on Power Semiconductor Devices & ICs May 27-30, 2007, Jeju, Korea. The vertical MOSFET illustrated in FIG. 6 includes a trench 102 formed in an n type epitaxial layer 101. A field oxide film 104 is formed in the trench 102, and an n type gate polysilicon electrode 106 is formed to be surrounded by the field oxide film 104. Further, a pad oxide film 103 and a gate oxide film 105 are formed near the surface of the trench 102. Then, a p type body layer region 107 and an n type source region 108 are formed between each trench 102.

In order to fabricate the vertical MOSFET illustrated in FIG. 6, the n type epitaxial layer 101 is formed first. Then, a first trench having trench depth of about 1.5 µm is formed in the n type epitaxial layer 101 by etching, so as to form the pad oxide film 103 and a nitride film. Then, a second trench having trench depth of about 6.5 µm is formed in the n type epitaxial layer 101. This trench depth is to be the depth of the trench 102 illustrated in FIG. 6. After forming the second trench, the section where no nitride film is formed is oxidized by thermal oxidization, and then the field oxide film 104 of about 600 nm is formed. After that, the nitride film is removed, and the gate oxide film 105 of about 50 nm is formed by thermal oxidation. Then, the n type gate polysilicon electrode 106 is formed by depositing polysilicon in the trench 102. Further, the p type body region 107 and the n type source region 108 are formed, so as to fabricate the vertical MOSFET illustrated in FIG. 6.

As illustrated in FIG. 6, by forming the field oxide film 104 having a thicker film than the gate oxide film to a part of the vertical MOSFET trench 102, the withstand voltage between a drain and a source can be improved. Then, the concentration of an impurity to dope into the n type epitaxial layer 101 can be increased, thereby enabling to reduce the on-resistance Ron of the vertical MOSFET.

SUMMARY OF THE INVENTION

In the vertical MOSFET illustrated in FIG. 6, the field oxide film 104 for reducing the voltage between a drain and a source is formed to a part of the trench 102, and then the nitride film is removed, so as to form the gate oxide film 105. Then, the n type gate polysilicon electrode 106 is formed by depositing polysilicon in the trench 102 which includes the field oxide film 104 formed therein. At this time, as the field oxide film 104 is formed in the trench 102, the width (Wg) of the trench 102 including polysilicon deposited therein is narrow. Therefore, it is necessary to increase the width (Wt) of the trench 102 beforehand in consideration of depositing polysilicon.

However, increasing the width (Wt) of the trench 102 increases the trench pitch (Wp). On the other hand, the narrower the trench pitch, the larger the effect of improving the withstand voltage property by the field oxide film 104 in the trench 102. Accordingly, the present inventors have found a problem that increasing the trench pitch reduces the withstand voltage of the vertical MOSFET (on-resistance under the same withstand voltage increases).

An exemplary aspect of the present invention is a method of fabricating a semiconductor device according to the present invention that includes forming a first trench and a second trench by etching the first trench further, in an epitaxial layer formed over a substrate, extending a width of the second trench, forming an oxidize film by oxidizing the extended second trench, and filling an electrode material in the first trench and the second trench including the oxidized film formed therein.

The method of fabricating the semiconductor device according to the present invention enables to achieve wide enough opening widths of the first and the second trench for depositing an electrode material, and to further narrow the trench pitch, while forming a thick oxide film in the second trench. This enables to improve the withstand voltage between a drain and a source, and to reduce the on-resistance.

The present invention provides a method of fabricating a semiconductor device that enables to improve the withstand voltage between a drain and a source, and reduce the on-resistance.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE PREFERRED EMBODIMENTS

[First Exemplary Embodiment]

Hereinafter, a first exemplary embodiment of the present invention is explained with reference to the drawings.

Figure 1:
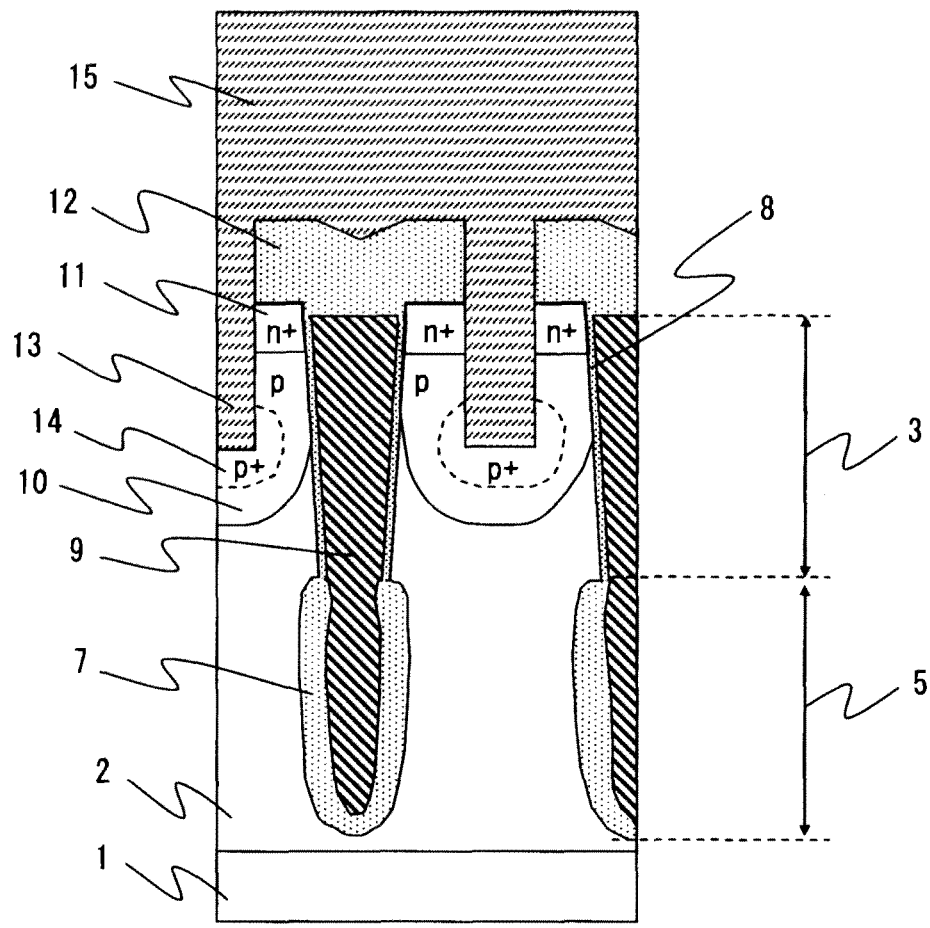
FIG. 1 is a cross-sectional diagram of a vertical MOSFET fabricated by a method of fabricating a semiconductor device according to a first exemplary embodiment.

FIG. 1 is a cross-sectional diagram of a vertical MOSFET fabricated by a method of fabricating a semiconductor device according to this exemplary embodiment. As illustrated in FIG. 1, a vertical MOSFET (semiconductor device) includes a first trench 3 formed in an epitaxial layer 2, a second trench 5 formed by further etching the first trench 3, an oxide film (field oxide film) 7 formed in the second trench 5, and an electrode 9 filled in the first and the second trench. Then, the second trench 5 includes an extended region extended in the width direction of the second trench 5. The oxide film 7 is formed over the extended region.

The method of fabricating a vertical MOSFET according to this exemplary embodiment having such configuration is explained with reference to FIGS. 2A to 2I.

Figure 2A:
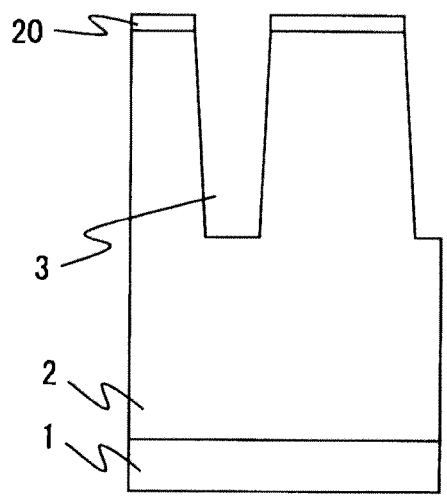
FIGS. 2A to 2I explain the method of fabricating a vertical MOSFET according to the first exemplary embodiment.

First, as illustrated in FIG. 2A, the epitaxial layer 2 is formed over a substrate 1. Then, the substrate 1 is patterned using a resist not illustrated as a mask by photolithography technique to form a mask film 20. As the mask film 20, a hard mask such as a silicon oxide film can be used, for example. The first trench 3 is formed by dry etching the epitaxial layer 2 using the mask film 20 as a mask. At this time, an n+ type semiconductor substrate can be used for the substrate 1, for example. Further, an n-type epitaxial layer can be used for the epitaxial layer 2, for example.

Figure 2B:
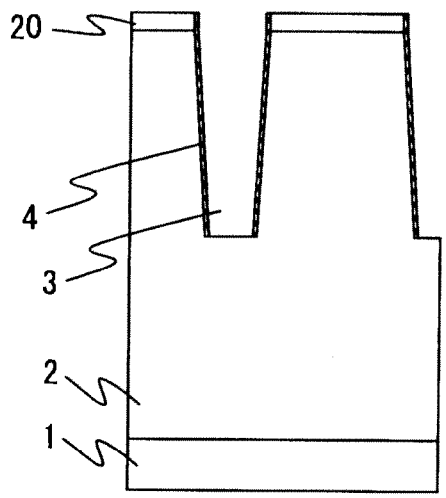
Figure 2C:
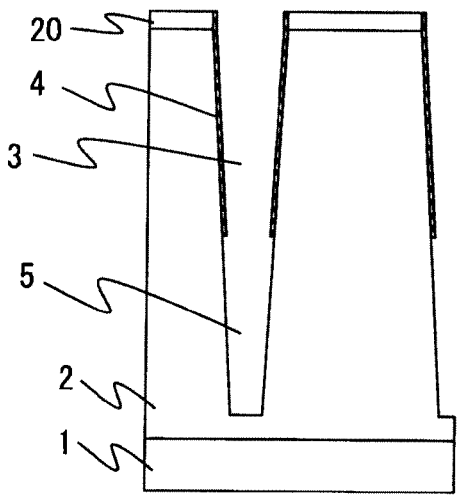

Next, as illustrated in FIG. 2B, a nitride film 4 is formed inside the first trench. Then, after forming the nitride film 4, the nitride film of the bottom part of the trench is removed using anisotropic etching, such as dry etching. Next, as illustrated in FIG. 2C, the second trench 5 is formed using dry etching or the like. At this time, the nitride film 4 formed to the side surface of the first trench 3 prevents from etching the first trench when forming the second trench.

Figure 2D:
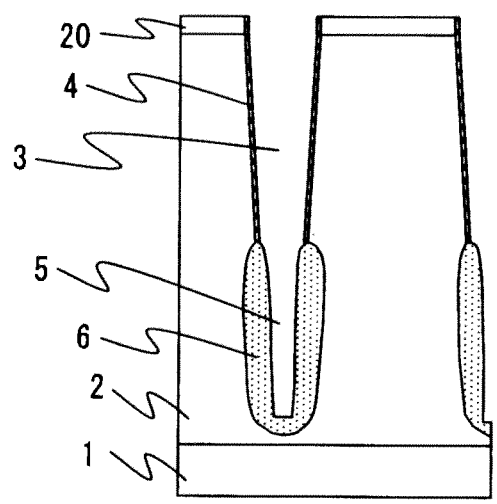

Next, as illustrated in FIG. 2D, an oxidization process is carried out to the epitaxial layer in the region where the second trench is formed, that is, the side and the bottom surface of the section where the second trench is formed, to form a sacrificial oxide film 6 in the second trench. By this oxidization process, the sacrificial oxide film is formed to extend in the width direction of the second trench 5. Further, at this time, the nitride film 4 is formed over the side surface of the first trench 3, thus the region where the first trench is formed is not oxidized.

Figure 2E:
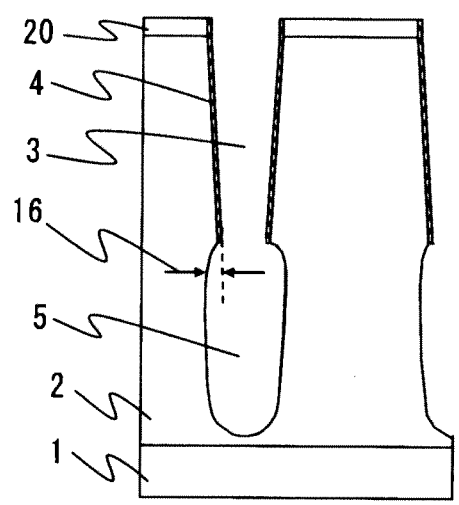

Next, as illustrated in FIG. 2E, the sacrificial oxide film 6 formed in the second trench 5 is removed by wet etching. Then, an extended part (Si eroded part) 16 is formed in the second trench 5 (the second trench 5 including the extended part 16 is hereinafter also referred to as an extended second trench 5). The size of this extended part 16 can be specified as appropriate by changing the film thickness of the sacrificial oxide film 6 formed in the process of FIG. 2D. Note that the extended part 16 of the second trench 5 is the section corresponding to a difference between the second trench obtained in the process of FIG. 2E and the second trench formed in the process of FIG. 2C.

Figure 2F:
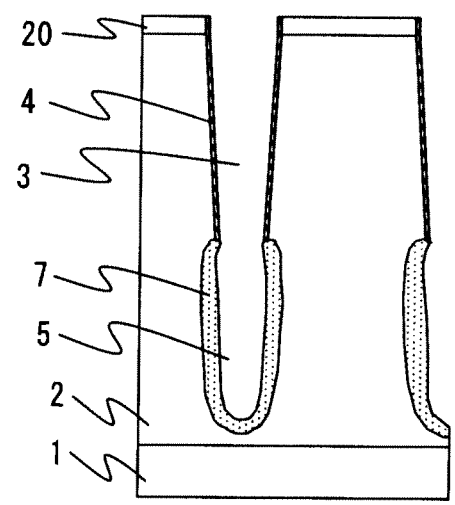
Figure 2G:
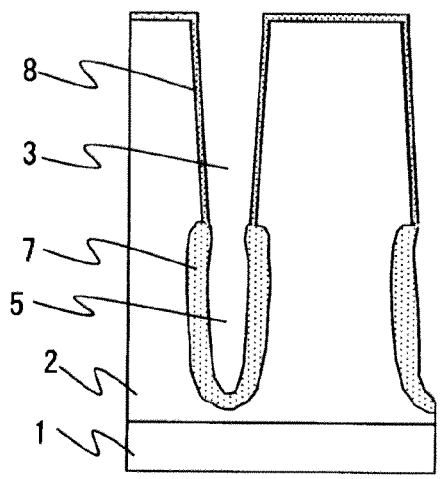

Next, as illustrated in FIG. 2F, the second extended trench 5 is oxidized to form the field oxide film (oxide film) 7. Then, as illustrated in FIG. 2G, the nitride film 4 is removed by etching. Further, a gate oxide film 8 is formed by performing an oxidation process. Note that the field oxide film 7 is oxidized further than at the time of FIG. 2F by the oxidization process for forming the gate oxidize film, and the thicker field oxide film 7 is formed.

Figure 2H:
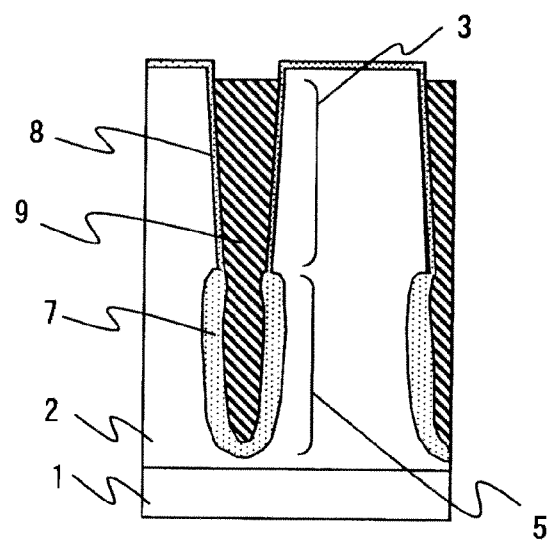

Next, as illustrated in FIG. 2H, an electrode material is filled in the second trench 5 including the first trench 3 and the field oxide film 7 formed therein, so as to form the gate electrode 9. At this time, polysilicon can be used as a material of the gate electrode 9, for example.

Figure 2I:
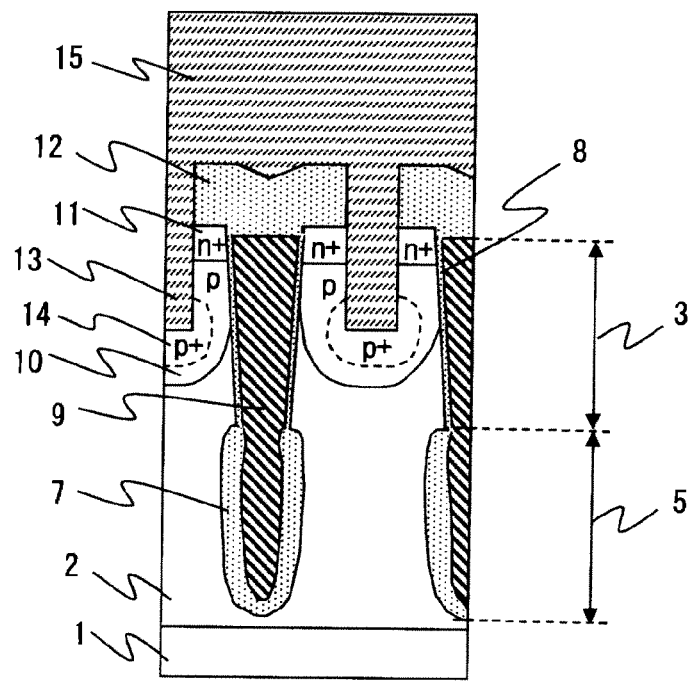

Next, as illustrated in FIG. 2I, after forming the gate electrode 9, a p-type base region 10, a p+ type base region 14, and an n+ type source region 11 are formed in a region between each gate electrode 9 by doping an impurity, for example. Moreover, a source trench 13 is formed by etching, and a source electrode 15 is deposited in the source trench. Further, an interlayer dielectric film 12 is formed between the gate electrode 9 and the source electrode 15. A general method of fabricating a vertical MOSFET can be used to form the p-type base region 10, the n+ type source region 11, the interlayer dielectric film 12, the source trench 13, the p+ type base region 14, and the source electrode 15.

In the method of fabricating a semiconductor device (vertical MOSFET) according to this exemplary embodiment, the second trench 5 is oxidized to form the sacrificial oxide film 6 in the process illustrated in FIG. 2D. In the process illustrated in FIG. 2E, the sacrificial oxide film 6 formed in the process illustrated in FIG. 2D is removed by etching so as to form the extended part (Si eroded part) 16 in the second trench 5. Then, in the processes of FIGS. 2F and 2G, an oxidation process (field oxidation process) is performed again to the extended part 16 in the second trench 5.

This enables to obtain opening widths of the first and the second trench, which are wide enough to deposit an electrode material, while forming a thick field oxide film in the second trench 5. Accordingly, in the semiconductor device according to this exemplary embodiment, there is no need to prepare a wide trench width in consideration of filling the electrode material in advance, thus the trench pitch can be narrowed. This enables to provide a method of fabricating a semiconductor device that improves the withstand voltage between a drain and a source, and reduces the on-resistance.

[Second Exemplary Embodiment]

Hereinafter, a second exemplary embodiment of the present invention is explained with reference to the drawings. A semiconductor device fabricated by a method of fabricating a semiconductor device according to this exemplary embodiment has the same configuration as the semiconductor device illustrated in FIG. 1. The method of fabricating the semiconductor device according to this exemplary embodiment is explained in detail hereinafter.

Figure 3A:
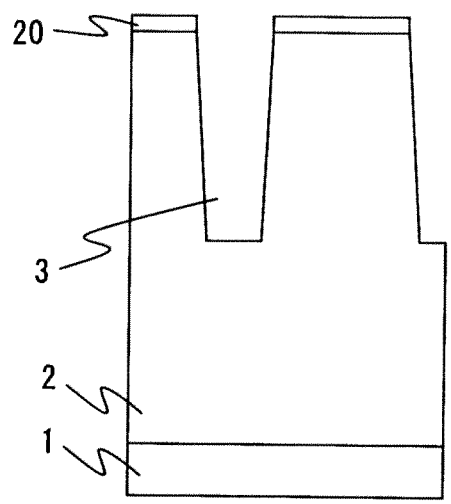
FIGS. 3A to 3H explain the method of fabricating a vertical MOSFET according to a second exemplary embodiment.

First, as illustrated in FIG. 3A, an epitaxial layer 2 is formed over a substrate 1. Then, the substrate is patterned using a mask film 20 by photolithography technique, and the first trench 3 is formed using dry etching etc. At this time, an n+ type semiconductor substrate can be used for the substrate 1, for example. Moreover, an n-type epitaxial layer can be used for the epitaxial layer 2, for example.

Figure 3B:
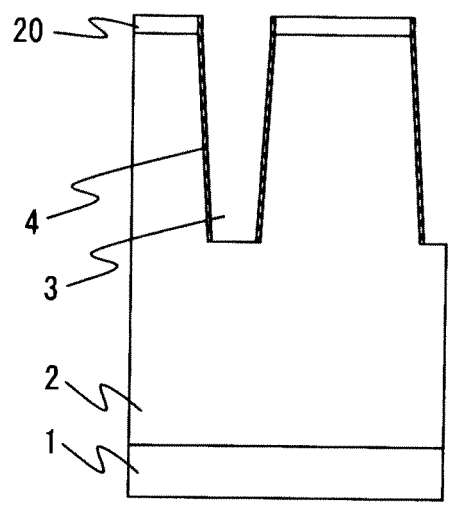
Figure 3C:
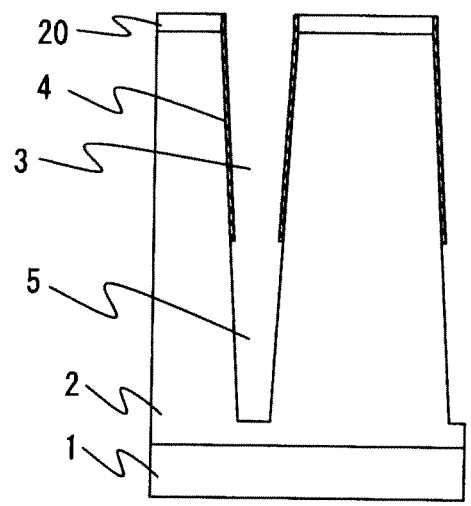

Next, a nitride film 4 is formed inside the first trench as illustrated in FIG. 3B. Then, after forming the nitride film 4, an anisotropic etching, such as dry etching, is used to remove the nitride film of the bottom part of the trench. Next, as illustrated in FIG. 3C, the second trench 5 is formed using dry etching etc. At this time, by the nitride film 4 formed to the side surface of the first trench 3, it is possible to prevent from etching the first trench when forming the second trench.

Figure 3D:
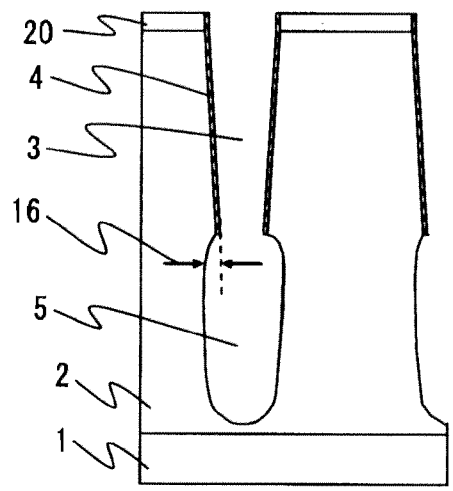

Next, the epitaxial layer of a region where the second trench 5 is formed as illustrated in FIG. 3D, that is, the side surface and the bottom surface of the section where the second trench is formed are etched using isotropic etching, such as chemical dry etching (CDE). Accordingly, the extended part 16 can be formed in the second trench. The size of this extended part 16 can be specified as appropriate by the condition of isotropic etching in the process of FIG. 3D. Note that the extended part 16 of the second trench 5 is the section corresponding to a difference between the second trench obtained in the process of FIG. 3D and the second trench formed in the process of FIG. 3C.

Figure 3E:
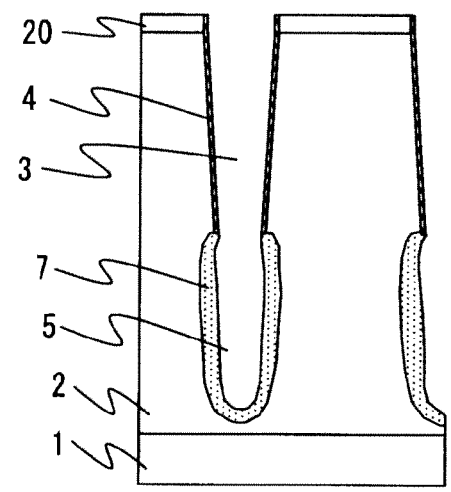
Figure 3F:
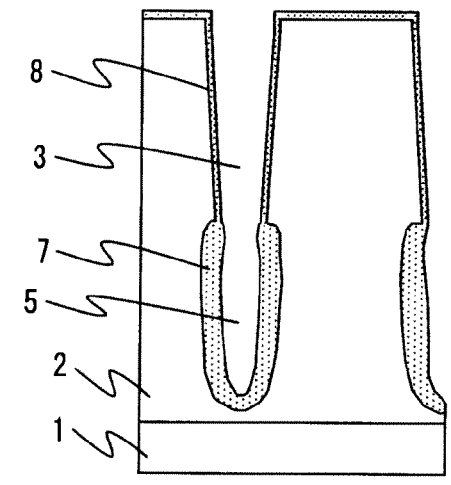

Next, as illustrated in FIG. 3E, the second extended trench 5 is oxidized and a field oxide film (oxide film) 7 is formed. Then, as illustrated in FIG. 3F, the nitride film 4 is removed by etching. A gate oxide film 8 is formed by carrying out an oxidation process. Note that the field oxide film 7 is oxidized further than at the time of FIG. 3E by the oxidization process for forming the gate oxidize film, and the thicker field oxide film 7 is formed.

Figure 3G:
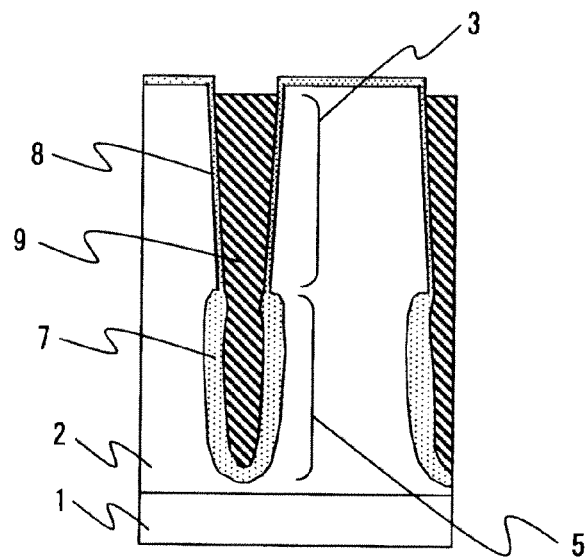

Next, as illustrated in FIG. 3G, an electrode material is filled in the second trench 5, which includes the first trench 3 and the field oxide film 7 formed therein, to faun the gate electrode 9. At this time, polysilicon can be used as the material of the gate electrode 9, for example.

Figure 3H:
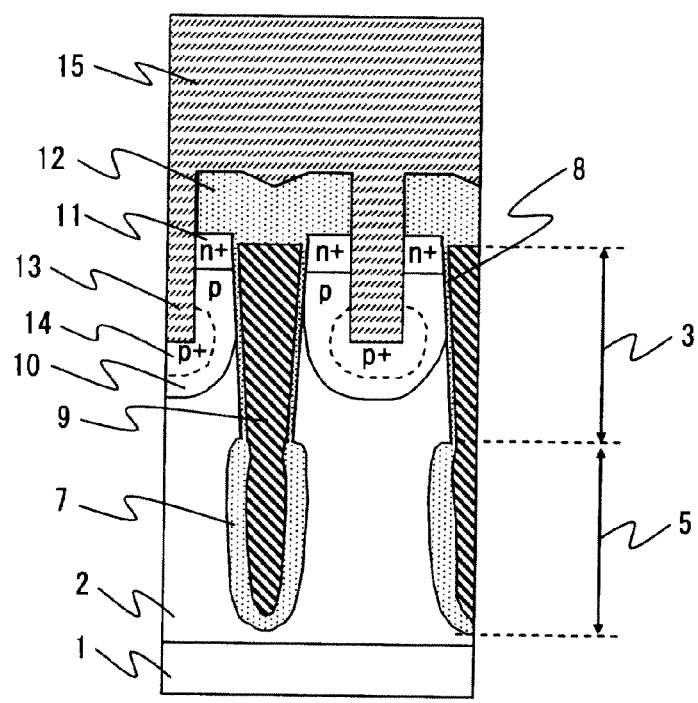

Next, as illustrated in FIG. 3H, after forming the gate electrode 9, a p-type base region 10, a p+ type base region 14, and an n+ type source region 11 are formed in a region between each gate electrode 9 by doping an impurity, for example. Further, a source trench 13 is formed by etching, and a source electrode 15 is deposited in the source trench. Furthermore, the interlayer dielectric film 12 is formed between the gate electrode 9 and the source electrode. A general method of fabricating a vertical MOSFET can be used to form the p-type base region 10, the n+ type source region 11, the interlayer dielectric film 12, the source trench 13, the p+ type base region 14, and the source electrode 15.

In the method of fabricating the semiconductor device (vertical MOSFET) according to this exemplary embodiment, as illustrated in FIG. 3D, an isotropic etching, such as chemical dry etching (CDE), is used to form the extended part in the second trench. Accordingly, in the method of fabricating the semiconductor device according to this exemplary embodiment, it is not necessary to form a sacrificial oxide film as in the first exemplary embodiment (see FIG. 2D), thereby enabling to simplify the fabrication process. Note that other exemplary advantages are same as the first exemplary embodiment, thus the explanation is omitted.

[Other Exemplary Embodiment]

The vertical MOSFET of FIG. 1 has a trench contact structure in which the trench 13 is formed in a source contact structure, and the structure in which the interlayer dielectric film 12 between a gate and a source is formed above the epitaxial layer 2. However, the configuration of the vertical MOSFET fabricated by the method of fabricating a semiconductor device according to the present invention is not limited to the above configuration, but may be the configuration in which an interlayer dielectric film is deposited in a trench, as illustrated in FIGS. 4 to 5B.

Figure 4:
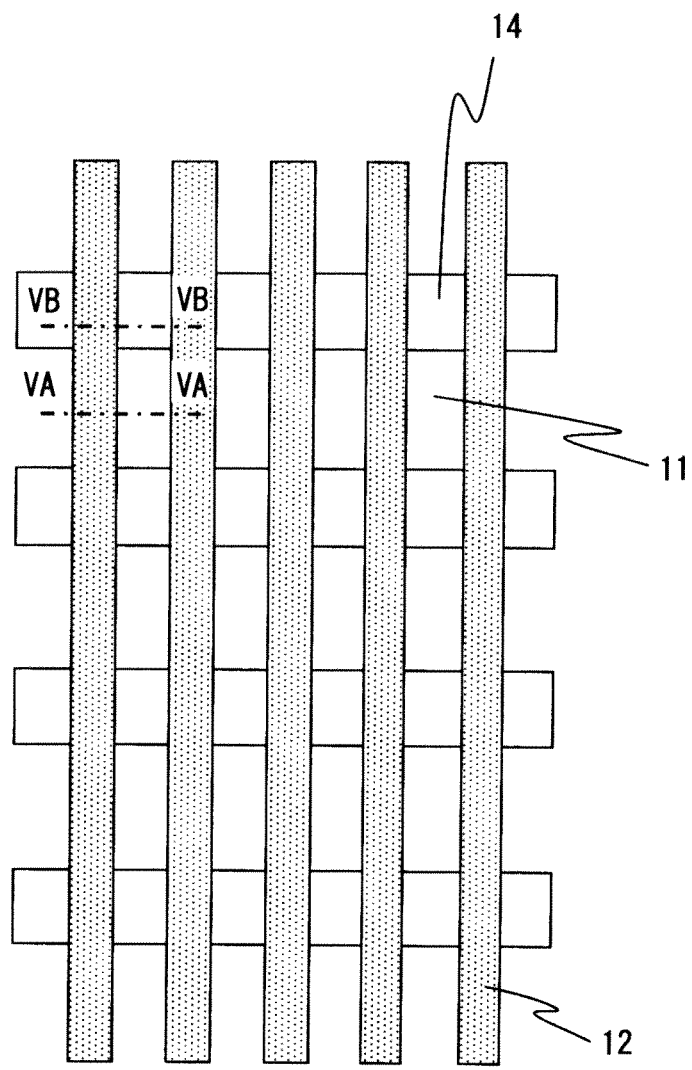
FIG. 4 is a top view illustrating the arrangement of an interlayer dielectric film, an n+ type source region, and a p+ type base region formed in a trench of a vertical MOSFET.
Figure 5A:
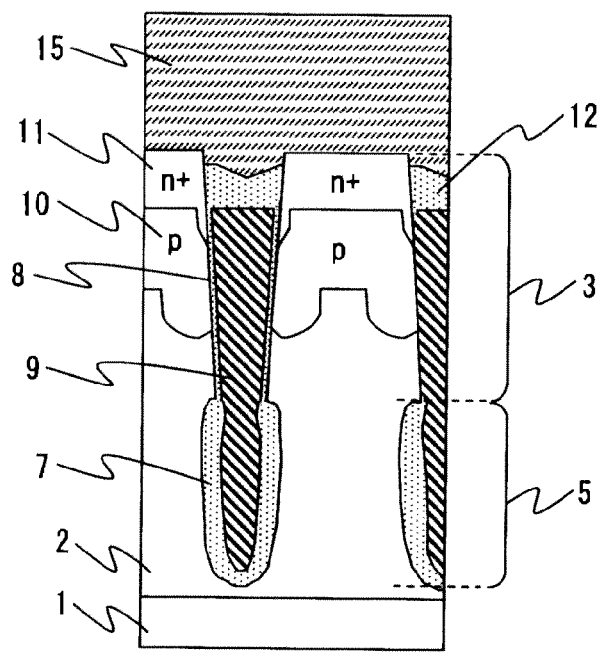
FIG. 5A is a cross-sectional diagram taken along the line VA-VA of FIG. 4.

FIG. 4 is a top view illustrating the arrangement of an interlayer dielectric film 12, an n+ type source region 11, and a p+ type base region 14 formed in the trench of the vertical MOSFET. FIG. 5A is a cross-sectional diagram of the vertical MOSFET taken along the line VA-VA of FIG. 4. FIG. 5B is a cross-sectional diagram of the vertical MOSFET taken along the line VB-VB of FIG. 4.

Figure 5B:
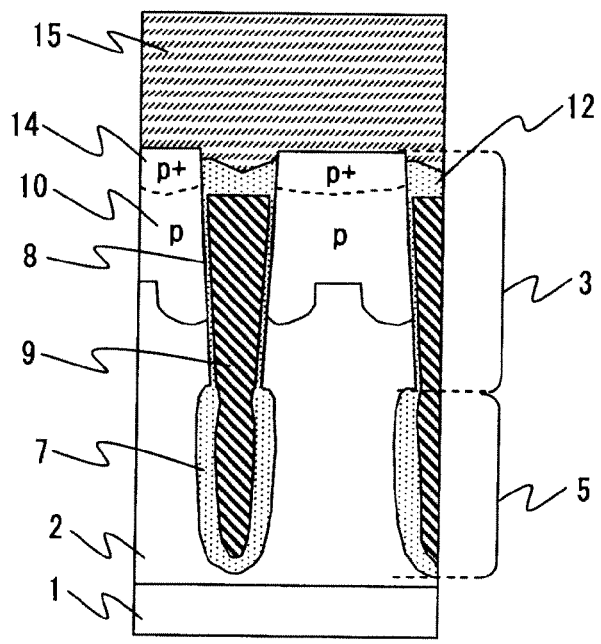
FIG. 5B is a cross-sectional diagram taken along the line VB-VB of FIG. 4.
Figure 6:
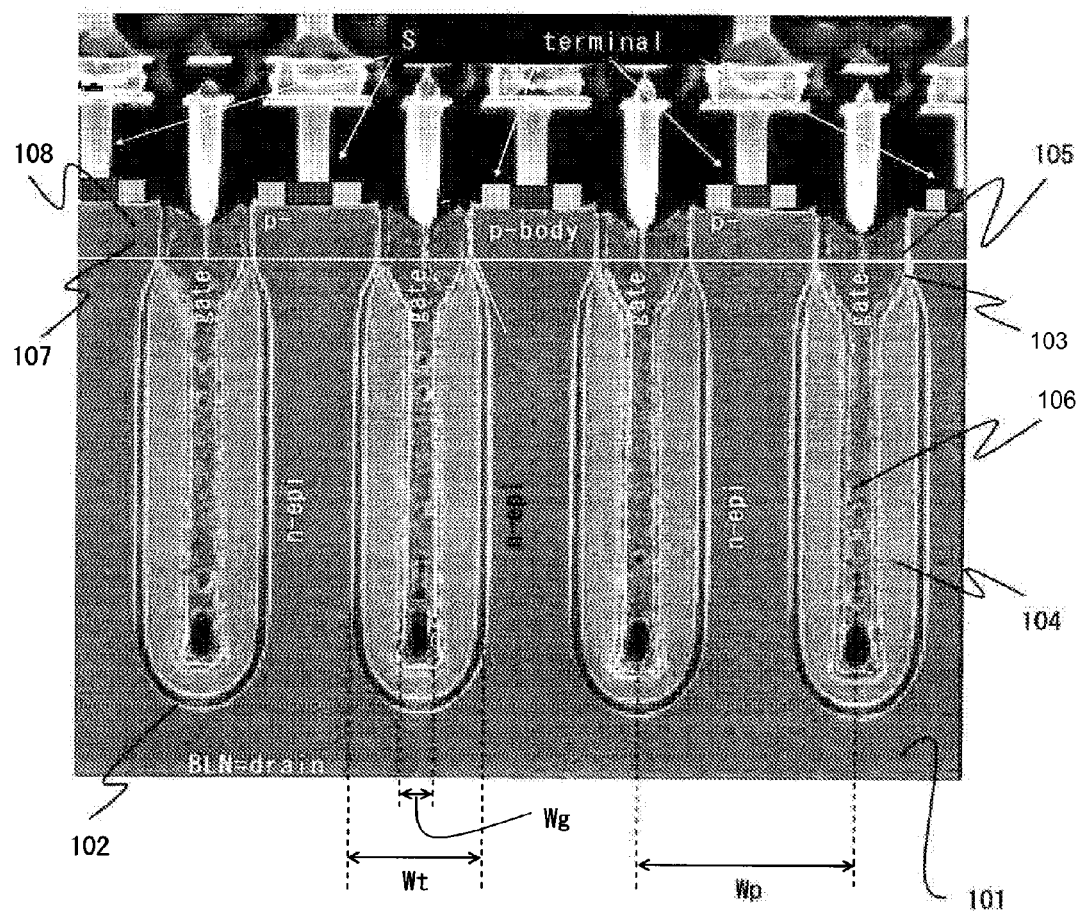
FIG. 6 is a cross-sectional diagram of a vertical MOSFET according to a prior art.

The vertical MOSFET (semiconductor device) illustrated in FIGS. 5A and 5B also includes a first trench 3 formed in an epitaxial layer 2, a second trench 5 formed by etching the first trench 3 further, an oxide film (field oxide film) 7 formed in the second trench 5, and an electrode 9 filled in the first and the second trench. Then, the second trench 5 includes an extended region which is extended in the width direction of the second trench 5. The oxide film 7 is formed in the extended region of the second trench 5.

Then, as illustrated in the cross-sectional diagram of FIG. 5A, the interlayer dielectric film 12 for isolating the gate electrode 9 and the source electrode 15 is formed to be deposited inside the first trench 3. Moreover, a p-type base region 10 and an n+ type source region 11 are formed in a region between each trench (between each gate electrode 9) by doping an impurity, for example. Then, a source electrode 15 is formed over the interlayer dielectric film 12 and the n+ type source region 11.

As illustrated in the cross-sectional diagram of FIG. 5B, the interlayer dielectric film 12 for isolating the gate electrode 9 and the source electrode 15 is formed to be deposited inside the first trench 3. Moreover, the p-type base region 10 and the p+ type base region 14 are formed in a region between each trench (between each gate electrode 9) by doping an impurity, for example. Then, the source electrode 15 is formed over the interlayer dielectric film 12 and the p+ type base region 14.

That is, as illustrated in the top view of FIG. 4, the interlayer dielectric film 12 illustrated in FIGS. 5A and 5B is arranged in the vertical direction of the drawing. Further, the n+ type source region 11 illustrated in FIG. 5A and the p+ type base region 14 illustrated in FIG. 5B are arranged alternately, and the interlayer dielectric film 12 is arranged therebetween, in the vertical direction of the drawing.

In the vertical MOSFET illustrated in FIGS. 5A and 5B, the bottom surface of the p-type base region 10 and the n+ type source region 11 is deep near the first trench 3. This reason is explained hereinafter. In the vertical MOSFET according to this exemplary embodiment, in order to deposit the interlayer dielectric film 12 in the first and the second trench 3 and 5, the upper edge of the gate electrode (polysilicon) 9 is formed to be lower than the upper edge of the first trench 3, in the process to fill the electrode material illustrated in FIG. 2H. Then, if an impurity is doped in order to form the p-type base region 10 and the n+ type source region 11 in this state, an impurity is doped also from the upper part of the sidewall of the first trench 3 (the section of the sidewall above the gate electrode 9). Therefore, the p-type base region 10 and the n+ type source region 11 are formed to be deep near the first trench 3. However, the process to dope the impurity can be carried out even after etchback of the interlayer dielectric film 12. Thus in this case, the bottom surface of the p-type base region 10 and the n+ type source region 11 is flatter than the case of FIGS. 5A and 5B.

The first to other exemplary embodiments can be combined as desirable by one of ordinary skill in the art.

The above description was given by taking a MOSFET as a semiconductor device, for example, the invention can also be applied in an IGBT (Insulated Gate Bipolar Transistor).

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A method of fabricating a semiconductor device which comprises a vertical MOSFET comprising:
    forming a first trench in a semiconductor layer;
    forming a second trench in the semiconductor layer by etching beneath the first trench;
    extending a width of the second trench to form an extended second trench;
    forming a field oxide film by oxidizing the extended second trench;
    forming a gate oxide film by oxidizing the first trench, wherein a thickness of the gate oxide film is thinner than that of the field oxide film;
    forming a gate electrode in the first trench and the extended second trench after forming the field oxide film and the gate oxide film;
    forming a channel region in the semiconductor layer; and
    forming a source region in the channel region.

2. The method according to claim 1, wherein the extending a width of the second trench comprises:
    forming a sacrificial oxidize film in the second trench by oxidizing the second trench; and
    removing the sacrificial oxidize film.

3. The method according to claim 1, wherein the extending a width of the second trench comprises isotropic etching after forming the second trench.

4. The method according to claim 3, wherein the isotropic etching is chemical dry etching.

5. The method according to claim 1, further comprising:
    forming a nitride layer on a side wall of the first trench between forming a first trench and forming a second trench; and
    removing the nitride layer between forming a field oxide film and forming a gate oxide film.

6. The method according to claim 1, further comprising:
    forming a source trench penetrating through the source region to reach the channel region; and
    forming a source electrode in the source trench.

7. The method according to claim 1, further comprising:
    depositing an interlayer dielectric film inside the first trench after forming a gate electrode.

8. The method according to claim 1, wherein the semiconductor layer is an epitaxial layer formed over a substrate.

* * * * *